United States Patent
Muraki et al.

(10) Patent No.: US 7,875,474 B2
(45) Date of Patent: Jan. 25, 2011

(54) GALLIUM NITRIDE-BASED COMPOUND SEMICONDUCTOR LIGHT-EMITTING DEVICE AND PRODUCTION METHOD THEREOF

(75) Inventors: Noritaka Muraki, Chichibu (JP); Hironao Shinohara, Ichihara (JP); Hiroshi Osawa, Chiba (JP)

(73) Assignee: Show A Denko K.K., Tokyo (JP)

( * ) Notice: Subject to any disclaimer, the term of this patent is extended or adjusted under 35 U.S.C. 154(b) by 211 days.

(21) Appl. No.: 12/065,564

(22) PCT Filed: Sep. 5, 2006

(86) PCT No.: PCT/JP2006/317931

§ 371 (c)(1),
(2), (4) Date: Mar. 3, 2008

(87) PCT Pub. No.: WO2007/029842

PCT Pub. Date: Mar. 15, 2007

(65) Prior Publication Data

US 2009/0267103 A1  Oct. 29, 2009

Related U.S. Application Data

(60) Provisional application No. 60/716,963, filed on Sep. 15, 2005, provisional application No. 60/752,962, filed on Dec. 23, 2005.

(30) Foreign Application Priority Data

Sep. 6, 2005 (JP) ............................. 2005-258135
Dec. 14, 2005 (JP) ............................. 2005-360291

(51) Int. Cl.
*H01L 21/00* (2006.01)

(52) U.S. Cl. .............................. 438/29; 438/46; 438/47; 257/13; 257/79; 257/E33.025; 257/E33.065

(58) Field of Classification Search .................. 438/46, 438/29, 47; 257/13, 79, 80, 85, 99, E33.025, 257/E33.065, E33.066
See application file for complete search history.

(56) References Cited

U.S. PATENT DOCUMENTS 6,060,730 A  5/2000  Tsutsui (Continued)

FOREIGN PATENT DOCUMENTS

CN  1433088 A  7/2003

OTHER PUBLICATIONS

Hung-Wen Huang et al., Improvement of InGaN-GaN Light-Emitting Diode Performance with a Nano-Roughened p-GaN Surface, IEEE Photonics Technology Letters, vol. 17, No. 5, pp. 983-985, May 2005.

(Continued)

*Primary Examiner*—Hsien-ming Lee
(74) *Attorney, Agent, or Firm*—Sughrue Mion, PLLC

(57) ABSTRACT

The invention provides a gallium nitride based compound semiconductor light emitting device with excellent light extracting efficiency and its production method. A light emitting device, obtained from a gallium nitride based compound semiconductor, includes a substrate; a n-type semiconductor layer 13, a light emitting layer 14, and a p-type semiconductor layer 15, sequentially stacked on a substrate 11; a light-permeable positive electrode 16 stacked on the p-type semiconductor layer 15; a positive electrode bonding pad 17 provided on the light-permeable positive electrode 16; and a negative electrode bonding pad provided 18 on the n-type semiconductor layer 13, wherein a disordered uneven surface formed at least on a part of the surface 15a of the p-type semiconductor layer 15.

5 Claims, 2 Drawing Sheets

U.S. PATENT DOCUMENTS

| | | | |
|---|---|---|---|
| 6,369,506 B1 * | 4/2002 | Hata | 313/499 |
| 6,924,163 B2 * | 8/2005 | Okazaki et al. | 438/46 |
| 2002/0145148 A1 | 10/2002 | Okuyama et al. | |
| 2003/0218179 A1 | 11/2003 | Koide et al. | |
| 2004/0026709 A1 | 2/2004 | Bader et al. | |
| 2004/0119082 A1 * | 6/2004 | Sugawara | 257/94 |
| 2005/0082562 A1 * | 4/2005 | Ou et al. | 257/103 |
| 2005/0139840 A1 | 6/2005 | Lai et al. | |

FOREIGN PATENT DOCUMENTS

| | | |
|---|---|---|
| EP | 1329961 A2 | 7/2003 |
| JP | 6-291368 A | 10/1994 |
| JP | 7-78807 A | 3/1995 |
| JP | 2005-158788 A | 6/2005 |
| JP | 2005-191575 A | 7/2005 |
| TW | 481932 | 4/2002 |
| TW | 577181 | 2/2004 |

OTHER PUBLICATIONS

Taiwanese Office Action dated Dec. 21, 2009, for TW Patent Application No. 095132762.

* cited by examiner

GALLIUM NITRIDE-BASED COMPOUND SEMICONDUCTOR LIGHT-EMITTING DEVICE AND PRODUCTION METHOD THEREOF

CROSS REFERENCE TO RELATED APPLICATIONS

Priority is claimed on Japanese Patent Application No. 2005-258135, filed Sep. 6, 2005, and Japanese Patent Application No. 2005-360291, filed Dec. 14, 2005. This application is an application filed under 35 U.S.C. §111(a) claiming pursuant to 35 U.S.C. §119(e) of the filing date of Provisional Application 60/716,963 on Sep. 15, 2005, and Provisional Application 60/752,962 on Dec. 23, 2005, pursuant to 35 U.S.C. §111(b).

TECHNICAL FIELD

The present invention is related to a gallium nitride based compound semiconductor light emitting device with especially superior output power and its production method.

BACKGROUND ART

In recent years, gallium nitride (GaN) based compound semiconductor light emitting device has been attracting attention as a short wavelength light emitting device. This gallium nitride based compound semiconductor light emitting device is formed using a method such the metal-organic chemical vapor deposition method (MOCVD method) or the molecular beam epitaxial method (MBE method) on substrates of various oxides or group III to group V compounds starting with sapphire single crystal.

Small electric current diffusion in the transverse direction is one of the features of gallium nitride based compound semiconductor light emitting device. For this reason, current is injected only in the semiconductor directly below the electrode, the light emitted from the light emitting layer directly below the electrode is blocked off by the electrode, and it becomes difficult to extract the light from the light emitting device. That is why such light emitting devices are configured by generally using a transparent electrode as the positive electrode so that light can be extracted through the positive electrode.

Conventional light-permeable positive electrodes made of transparent electrodes were stacked structures made by combining oxides of Ni, Co and the like with a contact metal such as Au. In recent years however, higher electrically conductive oxides, such as ITO ($In_2O_3$—$SnO_2$) are being used, the film thickness of contact metal has reduced considerably, positive electrodes with stacked structure of light-permeability have been adopted, and techniques for extracting light with a high efficiency from the light emitting layer are being proposed.

The external quantum efficiency of such light emitting devices, however, is expressed as the product of the light extracting efficiency and the internal quantum efficiency. The internal quantum efficiency is the part of the current energy injected in the light emitting device that has been converted to light. On the other hand, the light extracting efficiency is the part of the light generated within the semiconductor crystal that can be extracted outside it.

In recent years, the internal quantum efficiency of the light emitting device is said to have improved by as much as 70% to 80% by improvements to the crystalline state and studies on the structure so that adequate effects corresponding to the injected current quantity are now being obtained.

However, the light extracting efficiency corresponding to the injected current is generally low not only in gallium nitride based compound semiconductor light emitting devices but also in light emitting diodes (LED), and the internal emitted light is not being extracted outside adequately compared to the injected current.

The emitted light extracting efficiency in gallium nitride based compound semiconductor light emitting devices is low because the light emitted in the light emitting layer is repeatedly reflected and absorbed by the crystalline material in the light emitting device structure. When reflection exceeds the critical angle according to Snell's Law, the probability that light is not extracted from outside the light emitting device, increases.

To improve the light extracting efficiency further, a gallium nitride based compound semiconductor light emitting device with improved light extracting efficiency obtained by roughening the emitted light extracting surface and by setting various angles to the light extracting surface has been proposed (for instance, see Patent Document 1).

However, the gallium nitride based compound semiconductor light emitting device produced by the method stated in Patent Document 1 has the problem that interference effect occurs in the uneven pattern on the semiconductor surface formed by the mask patterning method, and only light of a specific wavelength is emphasized.

Moreover, since a fine mask patterning method is required in the method of roughening the semiconductor layer surface, a complex and troublesome procedure has to be adopted in the processes, and the production efficiency drops.

Patent Document 1: Japanese Patent Application Laid-Open (kokai) No. H6-291368.

DISCLOSURE OF INVENTION

In the light of the problems mentioned above, the present invention has as its object to offer a gallium nitride based compound semiconductor light emitting device with excellent light extracting efficiency and with very little non-uniformity in wavelength, and its production method.

The inventors completed the present invention after earnestly studying the means to resolve the problems mentioned above.

That is, the present invention relates to the following:

[1] A gallium nitride based compound semiconductor light emitting device, obtained from a gallium nitride based compound semiconductor, comprising: a substrate; a n-type semiconductor layer, a light emitting layer, and a p-type semiconductor layer, sequentially stacked on a substrate; a light-permeable positive electrode stacked on the p-type semiconductor layer; a positive electrode bonding pad provided on the light-permeable positive electrode; and a negative electrode bonding pad provided on the n-type semiconductor layer, wherein a disordered uneven surface is formed at least on a part of surface of the p-type semiconductor layer.

[2] The gallium nitride based compound semiconductor light emitting device as set forth in [1], wherein the average distance between the convex parts in the disordered uneven surface formed on the surface of the p-type semiconductor layer is the distance between the centers of the convex parts and is in the range of 0.01 μm to 3 μm.

[3] The gallium nitride based compound semiconductor light emitting device as set forth in [1], wherein the average distance between the convex parts in the disordered uneven surface formed on the surface of the p-type semiconductor layer is the distance between the centers of the convex parts and is in the range of 0.05 μm to 1.5 μm.

[4] The gallium nitride based compound semiconductor light emitting device as set forth in [2] or [3] wherein the standard deviation of each distance between convex parts corresponding to the average distance between the convex parts is in the range of 10% to 80%.

[5] The gallium nitride based compound semiconductor light emitting device as set forth in any one of [1] to [4] wherein the light-permeable positive electrode is made of an electrically conductive oxide.

[6] The gallium nitride based compound semiconductor light emitting device as set forth in any of [1] to [5] wherein the light-permeable positive electrode is formed by at least one of the materials selected from a group comprising ITO ($In_2O_3$—$SnO_2$), AZO ($ZnO$—$Al_2O_3$), IZO ($In_2O_3$—$ZnO$), and GZO ($ZnO$—$GeO_2$).

[7] A gallium nitride based compound semiconductor light emitting device production method for forming an uneven surface at least on a part of a p-type semiconductor layer of the gallium nitride based compound semiconductor device comprising, the processes (1) to (3) below (1) Process for stacking an n-type semiconductor layer, a light emitting layer, and a p-type semiconductor layer sequentially to form gallium nitride based compound semiconductor on the substrate;

(2) Process for forming mask made of metallic fine particles on the p-type semiconductor layer; and (3) Process for dry-etching a p-type semiconductor layer from above the mask.

[8] The production method of gallium nitride based compound semiconductor light emitting device as set forth in [7] wherein the process (2) comprises a process to form a metallic thin film on the p-type semiconductor layer and a heat treatment process after the formation of the metallic thin film.

[9] The production method of gallium nitride based compound semiconductor light emitting device as set forth in [7] or [8] wherein the metallic fine particles that form the mask are made of Ni or Ni alloy.

[10] The production method of gallium nitride based compound semiconductor light emitting device as set forth in any of [7] to [9] wherein the metallic fine particles that form the mask are made of a low melting point metal or a low melting point alloy with the melting point in the range of 100° C. to 450° C.

[11] The production method of gallium nitride based compound semiconductor light emitting device as set forth in any of [7] to [10] wherein the metallic fine particles that form the mask are made of a low melting point metal selected from a group comprising Ni, Au, Sn, Ge, Pb, Sb, Bi, Cd, and In, or is at least a low melting point alloy that includes at least one of these metals.

[12] A lamp made of gallium nitride based compound semiconductor light emitting device as set forth in any of [1] to [6].

[13] A lamp made of gallium nitride based compound semiconductor light emitting device obtained by the production method set forth in any of the [7] to [11].

According to the gallium nitride based compound semiconductor light emitting device of the present invention, when at least a part of the surface of the light-permeable positive electrode is formed as a disordered uneven surface, gallium nitride based compound semiconductor light emitting device with excellent light extracting efficiency and very little non-uniformity in wavelength can be obtained.

When a lamp shape is processed using gallium nitride based compound semiconductor light emitting device of the present invention, light focusing can be enhanced according to the characteristics of the resin used in the lamp. Thus, a lamp with high output power can be obtained.

The roughening process to form the uneven surface in the production method of gallium nitride based compound semiconductor light emitting device of the present invention particularly accomplishes the effects given in (1) to (2) below.

(1) By forming the uneven surface with a certain variation in the range, interference effects are suppressed and gallium nitride based compound semiconductor light emitting device can be produced with very little non-uniformity in wavelength.

(2) Sophisticated mask patterning process is not required because the uneven surface is formed using a metallic fine particle mask that enables a roughened microprocessing region to be formed easily and economically.

EXPLANATION OF REFERENCE NUMERALS IN FIGURES

1 . . . gallium nitride based compound semiconductor light emitting device, 11 . . . substrate, 12 . . . buffer layer, 13 . . . n-type semiconductor layer, 14 . . . light emitting layer, 15 . . . p-type semiconductor layer, 16 . . . light-permeable positive electrode, 16a . . . surface, 17 . . . positive electrode bonding pad, 18 . . . negative electrode bonding pad, 21 . . . substrate, 22 . . . buffer layer, 23 . . . n-type semiconductor layer, 24 . . . light emitting layer, 25 . . . p-type semiconductor layer, 26 . . . light-permeable positive electrode, 27 . . . negative electrode bonding pad, 30 . . . lamp, 31 . . . frame, 32 . . . frame, 33 . . . wire, 34 . . . wire, 35 . . . mold

BEST MODE FOR CARRYING OUT THE INVENTION

An Example of the gallium nitride based compound semiconductor light emitting device of the present invention is described here appropriately referring to the FIGS. 1 to 4.

[Overall Configuration of Gallium Nitride Based Compound Semiconductor Light Emitting Device]

Figure 1:
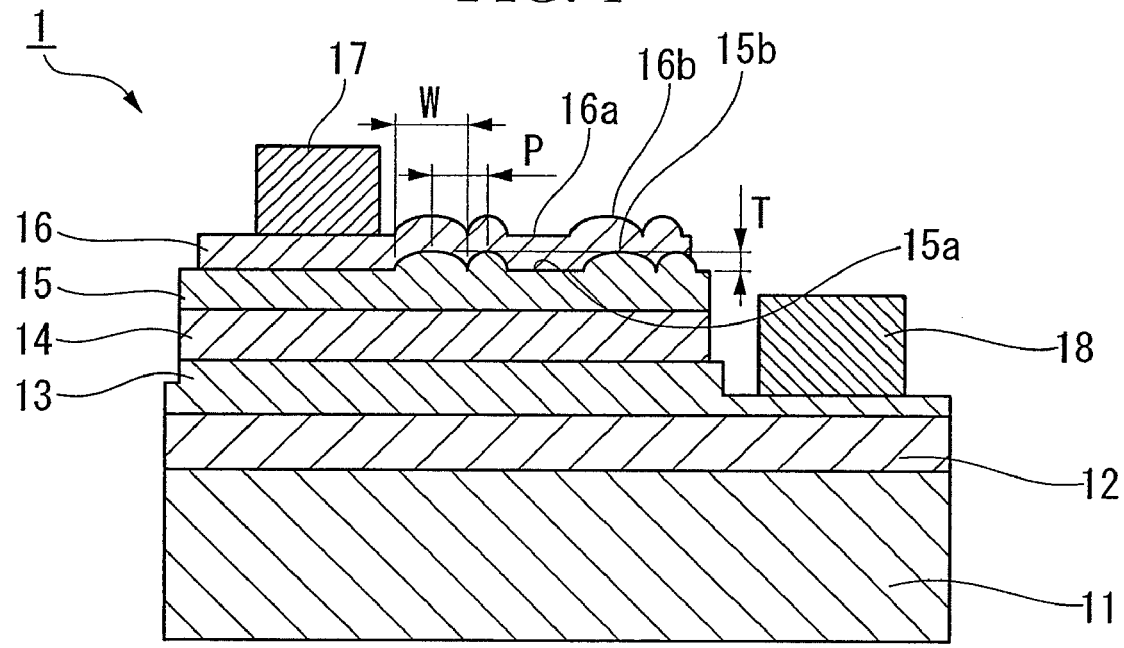
FIG. 1 is a schematic sketch that explains the gallium nitride based compound semiconductor light emitting device of the present invention, and it shows the cross section of the structure.

The gallium nitride based compound semiconductor light emitting device 1 of the present Example shown in FIG. 1, comprises a gallium nitride based compound semiconductor formed by sequentially stacking an n-type semiconductor layer 13, a light emitting layer 14, and a p-type semiconductor layer 15 on a substrate 11; a light-permeable positive electrode 16 stacked on the p-type semiconductor layer 15, a positive electrode bonding pad 17 provided on the light-permeable positive electrode 16, and a negative bonding pad 18 provided on the n-type semiconductor layer 13. A disordered uneven surface is formed on at least a part of surface 15a of the p-type semiconductor layer 15. A buffer layer 12 is provided between the substrate 11 and the n-type semiconductor layer 13 in the example shown in FIG. 1.

The light extracting efficiency of the gallium nitride based compound semiconductor light emitting device of the present invention is enhanced by providing uneven processing of special form on the surface 16a of the light-permeable positive electrode 15, which is the light extracting surface.

Various substrate materials including oxide crystals such as sapphire single crystal ($Al_2O_3$; A surface, C surface, M surface, R surface), spinel single crystal ($MgAl_2O_4$), ZnO single crystal, $LiAlO_2$ single crystal, $LiGaO_2$ single crystal, MgO single crystal, publicly known substrate materials of boride monocrystals such as Si single crystal, SiC single crystal, GaAs single crystal, AlN single crystal, GaN single crystal, and $ZrB_2$ may be used without any limitations. Even among these, it is preferable to use substrate materials made of sapphire single crystal and SiC single crystal.

There are no limitations on the orientation of the substrate. A substrate with zero off angle or one with an off-cut angle may be used.

Generally, n-type semiconductor layer 13, light emitting layer 14 and p-type semiconductor layer 15 made of gallium nitride based compound semiconductor are stacked on substrate 11 through the buffer layer 12. Sometimes the buffer layer 12 may not be required, depending on the growth conditions of the epitaxial layer or the substrate 11 used.

The gallium nitride based compound semiconductor represented by the general formula $Al_XGa_YIn_ZN_{1-A}M_A$ ($0 \leq X \leq 1$, $0 \leq Y \leq 1$, $0 \leq Z \leq 1$, and $X+Y+Z=1$). Notation M represents the group V element and is different from nitrogen (N); moreover, $0 \leq A < 1$) is widely known as gallium nitride based compound semiconductor. In this invention too, the well-known gallium nitride based compound semiconductors are included, and the gallium nitride based compound semiconductor represented by the general formula $Al_XGa_YIn_ZN_{1-A}M_A$ ($0 \leq X \leq 1$, $0 \leq Y \leq 1$, $0 \leq Z \leq 1$, and $X+Y+Z=1$. Notation M expresses a group V element different from nitrogen (N), and $0 \leq A < 1$) may be used without any limitations.

The gallium nitride based compound semiconductor can include other group III elements in addition to Al, Ga, and In. If necessary, elements such as Ge, Si, Mg, Ca, Zn, Be, P, As and B may also be included. Furthermore, elements are not limited to those added deliberately, impurities necessarily included depending on film formation conditions, and very small amount of impurities included in raw materials and reacting tube materials may also be included.

There are no limitations in particular on the growth methods of these gallium nitride based compound semiconductors, and all known methods for growth of nitride semiconductors, such as the metal-organic chemical vapor deposition method (MOCVD method), hydride vapor phase epitaxial method (HVPE), and molecular beam epitaxial method (MBE method) can be used. The preferred growth method considering controllability of film thickness and productivity is the MOCVD method. In the MOCVD method, hydrogen ($H_2$) or nitrogen ($N_2$) may be used as the carry gas, trimethyl gallium (TMG) or triethyl gallium (TEG) may be used as the Ga source, which is a group III raw material, trimethyl aluminum (TMA) or triethyl aluminum (TEA) may be used as the Al source, trimethyl indium (TMI) or triethyl indium (TEI) may be used as the In source, and ammonia ($NH_3$) or hydrazin ($N_2H_4$) may be used as the N source, that is, a group V raw material. For dopants, monosilane ($SiH_4$) or disilane ($Si_2H_6$) may be used as the Si raw material in n-type, and organic germanium compounds such as germane gas ($GeH_4$) or tetramethyl germanium (($CH_3)_4Ge$) tetraethyl germanium (($C_2H_5)_4Ge$) may be used as the Ge source. In the MBE method, elemental germanium may be used as the doped source. In the p-type, biscyclopentadienyl magnesium ($Cp_2Mg$) or bisethylcyclopentadienyl magnesium ($EtCp_2Mg$) may be used as the Mg raw material.

The n-type semiconductor layer 13 generally comprises the under layer, the n-contact layer and the n-cladding layer. The n-contact layer may comprise a under layer and/or an n-cladding layer.

The under layer should preferably comprise $Al_xGa_{1-x}N$ layers ($0 \leq x \leq 1$, preferably $0 \leq x \leq 0.5$, and more preferably $0 \leq x \leq 0.1$). The film thickness of the under layer should preferably be greater than 0.1 μm, more preferably greater than 0.5 μm, with a value greater than 1 μm being the best possible value. If the film thickness is increased in this way, then $Al_xGa_{1-x}N$ layer with good crystallinity can be easily obtained.

If the n-type impurity in the under layer is in the range of $1 \times 10^{17}$ to $1 \times 10^{19}/cm^3$, doping may be carried out. However, undoped ($<1 \times 10^{17}/cm^3$) is preferable since good crystallinity can be retained. There are no specific limitations on n-type impurities, and Si, Ge, or Sn may be used, with Si and Ge being the preferred impurities.

The growth temperature when growing the under layer should preferably be 800 to 1200° C., and should preferably be adjusted in the range of 1000 to 1200° C. If growth is within this temperature range, under layer of good crystallinity can be obtained. Furthermore, it is preferable to adjust the pressure in the MOCVD growth furnace in the range of 15 to 40 kPa.

The n-contact layer should preferably comprise $Al_xGa_{1-x}N$ layers ($0 \leq x \leq 1$, preferably $0 \leq x \leq 0.5$, and more preferably $0 \leq x \leq 0.1$), similar to the under layer. Furthermore, n-type impurities should preferably be doped. If N-type impurities have a concentration of $1 \times 10^{17}$ to $1 \times 10^{19}/cm^3$, preferably $1 \times 10^{18}$ to $1 \times 10^{19}/cm^3$, the ohmic contact with the negative electrode is satisfactorily retained, crack occurrence is suppressed, and good crystallinity can be retained. There are no specific limitations on n-type impurities, and Si, Ge, or Sn may be used, with Si and Ge being the preferred impurities. The growth temperature is the same as for the under layer.

The gallium nitride based compound semiconductors formed by the under layer and the n-contact layers should preferably have the same composition, with the film thickness set in the range of 1 to 20 μm, preferably set in the range of 2 to 15 μm, and more preferably set in the range of 3 to 12 μm. If the film thickness is within this range, the crystallinity of the semiconductor can be satisfactorily retained.

The n-cladding layer should preferably be provided between the n-contact layer and the light emitting layer. By providing the n-cladding layer, the deterioration of flatness that occurs in the uppermost surface of the n-contact layer can be compensated. The n-cladding layer maybe formed by AlGaN, GaN, GaInN, and the like. These structures may be super lattice structures formed by hetro-junctions or by stacking multiple layers. When GaInN is used, it is preferable to make the band gap larger than the band gap of GaInN of the light emitting layer.

Although there is no limitation on the film thickness of the n-cladding layer, it should be in the range of 0.005 to 0.5 µm, and preferably in the range of 0.005 to 0.1 µm. The n-type dopant concentration of n-cladding layer should preferably be in the range of $1\times10^{17}$ to $1\times10^{20}/cm^3$, and more preferably in the range of $1\times10^{18}$ to $1\times10^{19}/cm^3$. If the dopant concentration is within this range, satisfactory crystallinity can be retained and operating voltage of the light emitting device can be reduced.

The light emitting layer 14 is stacked on the n-type semiconductor layer 13. The light emitting layer generally makes use of gallium nitride based compound semiconductor, preferably a gallium nitride based compound semiconductor made of $Ga_{1-s}In_sN(0<s<0.4)$.

Although there is no limitation on the film thickness of the light emitting layer 14, the film thickness should be such that a quantum effect can be obtained. That is, critical film thickness is preferable, and it should be in the range of 1 to 10 nm; more preferably in the range of 2 to 6 nm. When the film thickness is in the range mentioned above, the output power is favorable.

The light emitting layer may be a single quantum well (SQW) structure as mentioned above. In addition, it may also be a multiple quantum well (MQW) structure formed by $Al_cGa_{1-c}N$ ($0 \leq c \leq 0.3$) barrier layer with band gap energy greater than the above-mentioned $Ga_{1-s}In_sN$ layer taken as the well layer. The well layer and the barrier layer may be doped with impurities.

The growth temperature of the $Al_cGa_{1-c}N$ barrier layer should preferably be greater than 700° C.; but it should more preferably be grown in the range of 800 to 1100° C. because the crystallinity is good. Also, GaInN well layer should be grown in the range of 600 to 900° C.; preferably, in the range of 700 to 900° C. That is, the growth temperature between layers should preferably be varied to obtain good crystallinity of MQW.

Generally, the p-type semiconductor layer 15 comprises p-clad and p-contact layers. However, the p-contact layer may be used as a p-cladding layer.

The p-cladding layer has a composition that gives a higher band gap energy of the light emitting layer. If the confinement of the carrier to the light emitting layer is possible, then there are no limitations. A p-cladding layer with $Al_dGa_{1-d}N$ ($0<d \leq 0.4$, preferably $0.1 \leq d \leq 0.3$) is preferred. A p-cladding layer made of AlGaN in this way is favorable considering confinement of the carrier to the light emitting layer. There are no limitations on the film thickness of the p-clad layer. It should preferably be in the range of 1 to 400 nm, and more preferably in the range of 5 to 100 nm. The p-type dopant concentration of the p-clad layer should preferably be $1\times10^{18}$ to $1\times10^{21}/cm^3$, and more preferably, $1\times10^{19}$ to $1\times10^{20}/cm^3$. If the p-type dopant concentration is within the above-mentioned range, then satisfactory p-type crystals can be obtained without loss of crystallinity.

The p contact layer should preferably be a gallium nitride based compound semiconductor layer including at least $Al_eGa_{1-e}N$ ($0 \leq e \leq 0.5$, preferably $0 \leq e \leq 0.2$, and more preferably, $0 \leq e \leq 0.1$). If the Al configuration is in the range mentioned above, good crystallinity can be retained and the ohmic contact with the p-ohmic electrodes becomes satisfactory.

If the p-type dopant has a concentration in the range of $1\times10^{18}$ to $1\times10^{21}/cm^3$, and more preferably, in the range of $5\times10^{19}$ to $5\times10^{20}/cm^3$, good ohmic contact is retained, crack occurrence is prevented, and good crystallinity is retained.

There are no limitations in particular to p-type impurities. For instance, Mg may be preferred as such an impurity.

There are no limitations in particular on the film thickness of p-contact layer. It should be in the range of 0.01 to 0.5 µm, and more preferably, in the range of 0.1 to 0.2 µm. When the film thickness is in the range mentioned above, the output power is favorable.

As shown in FIG. 1, uneven pattern is formed on at least a part of the surface 15a of the p-type semiconductor layer 15, and the surface is uneven. In the example shown in FIG. 1, a convex pattern made of multiple disordered convex parts 15b is formed on the surface 15a of the p-type semiconductor layer close to the center in the left-right direction of the gallium nitride based compound semiconductor light emitting device 1.

The conventional publicly known method of photolithography can be used as the method of forming the uneven pattern on the surface 15a of the p-type semiconductor layer 15.

The uneven pattern formed on the surface 15a is a disordered uneven pattern in the example shown in FIG. 1, but a pattern wherein the size of the convex parts and the distance between them have periodicity, may also be used.

There is no limitation on the shape of the convex part 14b, and the shape may be selected appropriately from a polygonal column such as cylindrical, triangular or quadrangular prism, or a polygonal pyramid such as cone, triangular or quadrangular pyramid and so on. Moreover, in the cross sectional shape shown in FIG. 1, the lower end width W of the convex part 14b may be the same as the upper end width, or preferably larger than the upper end width. The convex part 14b shown in the example in the figure has a shape that reduces in size as one moves from the lower end side to the upper end side.

Although there are no limitations on the size of the convex part 15b, the lower end width W should preferably be in the range of 0.01 µm to 3 µm. The light extracting efficiency improves effectively when the lower end width W is within this range.

The lower end width W of the convex part 15b can be made less than 0.01 µm using lithography; however, the cost becomes high, the convex part becomes too small, and adequate light extracting efficiency cannot be obtained.

Moreover, since the size of the gallium nitride based compound semiconductor light emitting device is generally in the range of 100 µm to 2000 µm, if the lower end width W of the convex part 15b exceeds 3 µm, the surface area of the convex part 15b per unit area becomes too small, and adequate light extracting efficiency cannot be obtained.

The lower end width should more preferably be in the range 0.02 µm to 2 µm.

There is no limitation in particular on the spacing P between the convex parts 15b if the pattern is periodic, but the distance between the peaks of the convex parts should preferably be in the range of 0.01 µm to 3 µm. The light extracting efficiency improves effectively when the average distance of the spacing P between the convex parts is within this range.

The spacing between the convex parts 15b can be made less than 0.01 µm using lithography; however, the cost becomes high, the pattern becomes too condensed, and adequate light extracting efficiency cannot be obtained.

Moreover, as mentioned above, the size of the light emitting device is generally in the range of 100 µm to 2000 µm; therefore, if the spacing of the convex parts 15b exceeds 3 µm, the surface area of the convex part 15b per unit area becomes too small, and adequate light extracting efficiency cannot be obtained. The range of 0.1 µm to 2 µm is more preferable.

There is no limitation in particular on T, the height of the convex part 15b, but T in the range of 0.1 m to 2.0 µm is preferable.

If T, the height of the convex part 15b is less than 0.1 µm, the height is inadequate, and it does not contribute to improving the light extracting efficiency. If the height of the convex part 15b exceeds 2.0 µm, although the height contributes to the light extracting efficiency, the productivity drops significantly, and this is not desirable.

The more preferable dimensions of the convex part 15 are to take the relationship of the lower end width W and the height T as W<T. If the above relationship is maintained, then the light extracting efficiency of the gallium nitride based compound semiconductor light emitting device can be effectively improved.

The standard deviation of the average distance between the convex parts 15b should preferably be in the range of 10% to 80%. The more preferable range is between 20% and 60%.

If the standard deviation mentioned above is less than 10%, the interference effect increases, and the probability of occurrence of non-uniformity in wavelength increases. Moreover, if the standard deviation mentioned above is greater than 80%, the density of the uneven pattern decreases, and the effect of improvement in the light extracting efficiency decreases.

The light-permeable positive electrode 16 should at least comprise light-permeable conductive oxide film layer in contact with p-type semiconductor layer 15. A positive electrode bonding pad 17 for electric contact with circuit board or lead frame or the like, is provided partially on the light-permeable conductive oxide film layer.

Also, as shown in FIG. 1, the surface 16a of the light-permeable positive electrode 16 is an uneven surface on which convex parts 16b are formed to correspond to the convex parts of the surface of the p-type semiconductor layer 15.

The light-permeable positive electrode 16 may be provided with materials that include at least one of the following; ITO ($In_2O_3$—$SnO_2$), AznO (ZnO—$Al_2O_3$), IZnO ($In_2O_3$—ZnO), GZO (ZnO—$GeO_2$), using conventional means well known in the technical field. Also, any kind of structure including conventional and publicly known structures may be used without any limitations.

The light-permeable positive electrode 16 may be formed to cover almost the entire surface of the p-type semiconductor layer 15, or it may be formed as a lattice structure or tree structure. After forming the light-permeable positive electrode 16, heat annealing with the aim of alloying and improvement of transparency, may or may not be performed.

The positive electrode bonding pad 17 is provided on the light-permeable positive electrode 16, and as shown in the example in FIG. 1, it is disposed at a position other than the uneven surface formed on the light-permeable positive electrode 16.

The positive electrode bonding pad 17 may be made using any of the well-known materials such as Au, Al, Ni, Cu, and so on without any limitations on the material or the construction.

The thickness of the positive electrode bonding pad 17 should preferably be in the range of 100 to 1000 nm. Based on the characteristics of the bonding pad, the larger its thickness, the higher is its bondability; therefore, it is preferable to use a positive electrode bonding pad with a thickness greater than 300 nm. Furthermore, its thickness should preferably be below 500 nm considering the production cost.

The negative electrode bonding pad 18 is formed so as to touch the n-type semiconductor layer 13 of the gallium nitride based compound semiconductor comprising the n-type semiconductor layer 13, the light emitting layer 14, and the p-type semiconductor layer 15 stacked on the substrate 11.

For this reason, when forming the negative electrode bonding pad 18, a part of the light emitting layer 14 and p-type semiconductor layer 15 is removed, the n-contact layer of the n-type semiconductor layer 13 is exposed, and the negative electrode bonding pad 18 is formed on it.

For the material of the negative electrode bonding pad 18, various compositions and constructions of negative electrode are well-known. These kinds of negative electrodes can be used without any limitation, and they can be provided with conventional means that are well known in the technical field.

Figure 3:
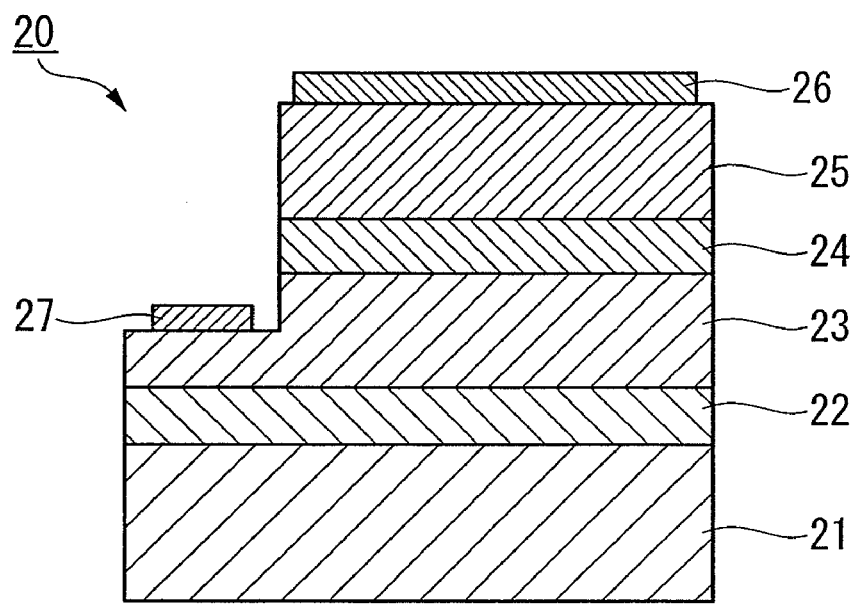
FIG. 3 is a schematic sketch that explains the gallium nitride based compound semiconductor light emitting device of the present invention, and it shows the cross section of the stacked structure of the gallium nitride based compound semiconductor.

As an example of the gallium nitride based compound semiconductor in which an area for forming a disordered uneven pattern on the light-permeable positive electrode is provided as above, the gallium nitride based compound semiconductor 20 shown in FIG. 3 comprising buffer layer 22, an n-type semiconductor layer 23, a light emitting layer 24, a p-type semiconductor layer 25 and a light-permeable positive electrode 26, are sequentially crystallized and grown to form a stacked structure, is well known.

In the present invention, the disordered uneven pattern as mentioned above, may be provided without any limitations on the surface of the p-type semiconductor layer 15 of the semiconductor light emitting devices with construction as in the gallium nitride based compound semiconductor 20.

[Production Method of Gallium Nitride Based Compound Semiconductor Light Emitting Device]

In the present invention, the processing area of the uneven pattern on the p-type semiconductor layer can be formed by forming a mask made of metallic fine particles on the surface of the p-type semiconductor layer in the relevant area, and dry-etching the p-type semiconductor layer from above the mask.

When forming the uneven pattern on the surface of the p-type semiconductor layer, the production method of gallium nitride based compound semiconductor light emitting device provided with each of the processes (1) to (3) below, may be used.

(1) Process for stacking an n-type semiconductor layer, a light emitting layer, and a p-type semiconductor layer sequentially to form a gallium nitride based compound semiconductor on the substrate.

(2) Process for forming mask made of metallic fine particles on the p-type semiconductor layer.

(3) Process for dry-etching p-type semiconductor layer from above the mask.

The processes (1) to (3) are described below.

<Process (1)>

(1) First, stack an n-type semiconductor layer, a light emitting layer, and a p-type semiconductor layer sequentially to form a gallium nitride based compound semiconductor on a substrate. Materials and growth method used conventionally for forming the stacked structure of the gallium nitride based compound semiconductor may be used without any limitations.

<Process (2)>

Next, form a metallic thin film made of metallic fine particles on the p-type semiconductor layer of the stacked structure made of the gallium nitride based compound semiconductor. The metallic thin film may be formed by a generally known vacuum evaporator.

In the present invention, the shape of the uneven pattern formed on the p-type semiconductor layer is specified by the shape of the metallic fine particle mask. Thus, the shape of the uneven pattern can be controlled by controlling the shape of the metallic fine particle mask.

Particularly, the shape of the uneven pattern on the p-type semiconductor layer is affected largely by the film thickness of the metallic fine particle mask.

The film thickness before the heat treatment process of the metallic fine particle mask should preferably be in the range of 0.005 μm to 1 μm. Although the optimum value of the film thickness of the metallic fine particle mask varies according to the quality of the metallic fine particle mask material and the material of the sealing resin used for making the lamp using the gallium nitride based compound semiconductor light emitting device of the present invention, if this value is less than 0.005 μm, the mask does not work as a mask, and an uneven pattern shape that can extract light effectively, cannot be formed on the p-type semiconductor layer. If the film thickness of the metallic fine particle mask exceeds 1 μm, the condensing effect becomes small. Similar to the above, an uneven pattern shape that can extract light effectively, cannot be formed on the p-type semiconductor layer.

If the thickness of metallic thin film can be controlled so that it remains uniform within the range mentioned above, then the formation of the thin metallic film is not limited to the vacuum evaporator mentioned above and a sputtering device or the like may be used without any problems.

The material of the metallic fine particles used in the metallic thin film (metallic fine particle mask) should preferably be a material with fine particles in spherical form and with good condensation properties. Ni and Ni alloys and so on are some examples of such a metal. Material of metallic fine metal particles with appropriate efficiency for the processes as well as condensation properties include Ni, Au, Sn, Ge, Pb, Sb, Bi, Cd, and In. At least one of these metals with low melting point between 100° C. and 450° C., or an alloy with low melting point should be used. From among these metallic materials, it is preferable to use AuSn alloy, AuGe alloy, AuSnNi alloy, and AuGeNi alloy, and among these, the use of AuSn is most preferable.

If the Sn composition ratio in AuSn alloy is in the range of 10% to 35% by weight, then it is known to form an eutectic alloy at a temperature of about 190 to 420° C. If the temperature exceeds this range, then it is generally known that a condensed form of the alloy layer can be obtained.

Next, heat treatment of metallic thin film is performed to obtain metallic fine particle mask from the metallic thin film mentioned above.

The heat treatment temperature of metallic thin film varies depending on the metallic material used, but it is generally preferable to perform heat treatment for one minute in the range of 100 to 600° C. Under these conditions, if heat treatment of the metallic thin film is performed, metallic fine particle mask can be formed on a p-type semiconductor layer.

The shape of the metallic fine particle mask after heat treatment changes according to the oxygen concentration in the heat treatment environment. For this reason, a metallic fine particle mask can be formed in a shape that improves the light extracting efficiency by controlling the oxygen concentration in the heat treatment environment, depending on the metallic material used. Furthermore, performing heat treatment in an environment that includes no oxygen at all may be favorable for obtaining a good mask, depending on the metallic material used.

The density of fine particles of the metallic fine particle mask should preferably be in the range of $1 \times 10^5/mm^2$ to $1 \times 10^8/mm^2$. The light extracting efficiency improves effectively in this range. A density in the range of $1 \times 10^6/mm^2$ to $1 \times 10^7/mm^2$ is more preferable.

<Process (3)>

Next, an uneven pattern of specific shape can be formed as mentioned above, on surface of the p-type semiconductor layer by dry etching the p-type semiconductor layer from above the metallic fine particle mask mentioned above.

The common reactive ion etching (RIE) mold can be used for dry etching. Although any kind of gas can be selected and used for dry etching without any limitations, a gas that includes chlorine is preferable for etching.

To prevent changes in the metallic condensation shape (metallic fine particle shape), the substrate temperature should preferably be maintained below 100° C.

The method of forming an uneven pattern on the p-type semiconductor layer by using dry etching is described in the present Example, but the invention is not limited to this method only. A method using wet etching may also be used.

The production method described above differs from the conventional method that uses dry etching resistance of metals. Its feature includes utilizing the micro-loading effect, which is generally a negative effect in dry etching that occurs by densification of the metallic fine particle mask.

This micro-loading effect is a phenomenon that alters the etching speed and the etching shape according to the percentage of the overall area of the mask opening area (area to be etched), partial pattern density of the mask opening, and absolute value of pattern width of the mask opening. Generally, a change in the etching speed and the etching shape is not preferable, but in the convex parts formed in the gallium based nitride semiconductor light emitting device of the present invention, when the shape is such that the lower end width W is the same as or larger than the upper end dimension, this effect can be utilized to the maximum.

In this method, a metal with high hardness and high melting point need not be used, and a metal with low melting point the shape of which can be easily controlled can be used to form the uneven shape in the mask. As a result, the method is very beneficial considering production aspects too.

A lamp comprising the gallium nitride based compound semiconductor light emitting devices of the present invention as described above, provided with a transparent cover can be realized by well-known means by a person skilled in the art. Furthermore, a white lamp can be configured by combining the gallium nitride based compound semiconductor light emitting devices of the present invention and a cover containing phosphor.

Figure 4:
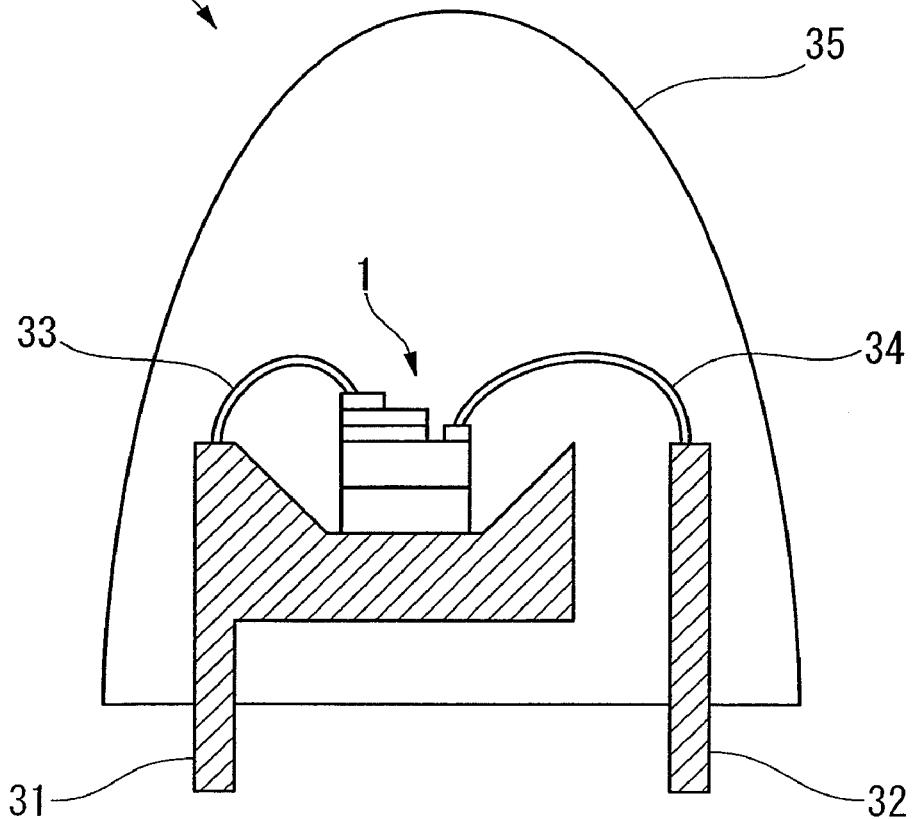
FIG. 4 is a schematic sketch that explains the lamp using the gallium nitride based compound semiconductor light emitting device of the present invention.

Also for instance, as shown in FIG. 4, the gallium nitride based compound semiconductor light emitting device of the present invention can be used to form an LED lamp without any limitations using conventional well-known methods. These lamps can be used in various applications as dome type lamp for general use, portable side view lamp for back lighting, top view lamp used in indicators and the like. For instance, to mount a face-up type gallium nitride based compound semiconductor light emitting device on the dome type lamp, as shown in the figure, bond the gallium nitride based compound semiconductor light emitting device 1 using resin or the like, to one of the two frames 31 or 32, use positive electrode bonding pad and negative electrode bonding pad that are wires 33 and 34 made of metal, and join each of these to frames 31 and 32 respectively. Subsequently, the dome type lamp 30 can be produced by molding the part around the device by transparent resin (refer to mold 35 of FIG. 4).

The driving voltage (Vf) of the gallium nitride based compound semiconductor light emitting device of the present invention is low, and the light extracting efficiency is excellent; therefore, a high efficiency lamp can be realized.

EXAMPLE

Next, this invention will be described in further details by Examples, but it is to be understood that the present invention is not to be limited to these Examples only.

Example 1

Figure 2:
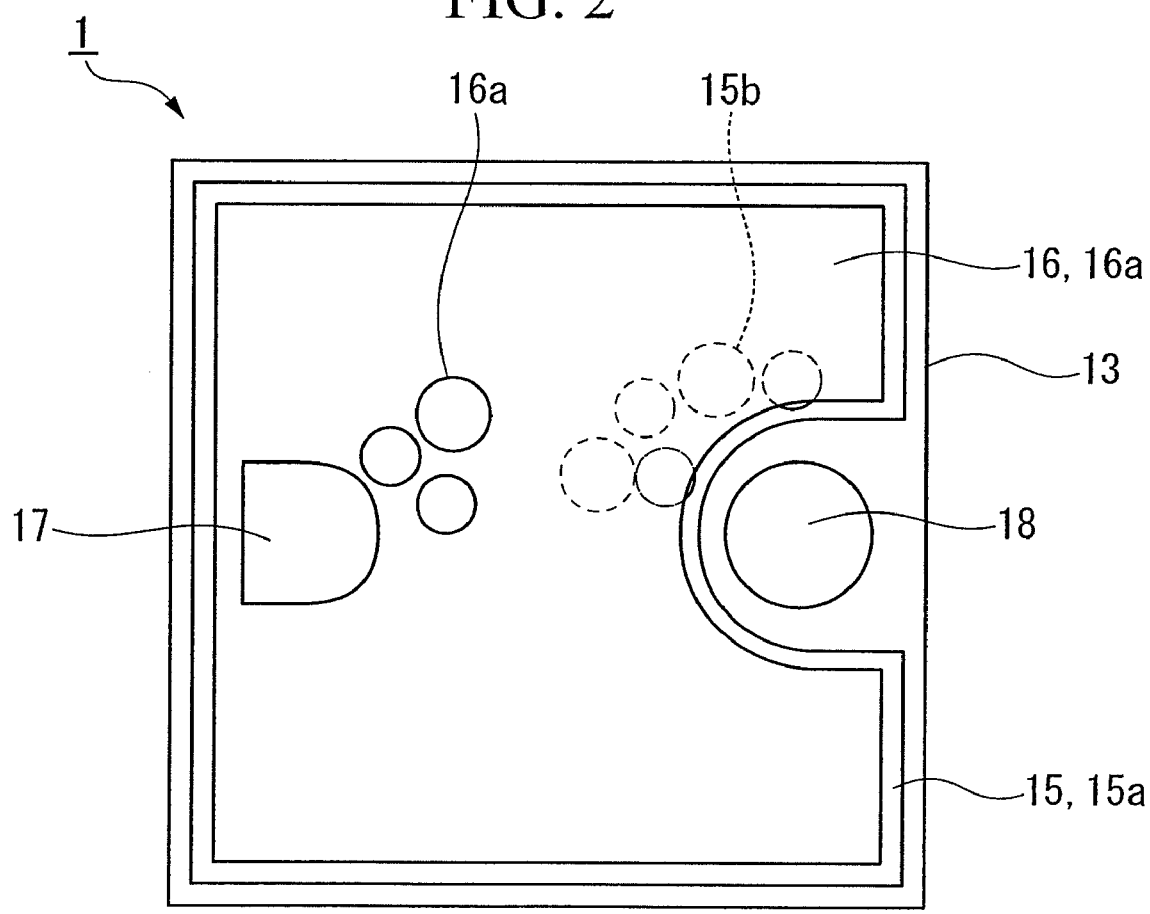
FIG. 2 is a schematic sketch that explains the gallium nitride based compound semiconductor light emitting device of the present invention, and it shows the plan view of the structure.

FIG. 1 shows a schematic drawing of the cross section of the gallium nitride based compound semiconductor light emitting device produced as an Example, while FIG. 2 shows a schematic drawing of the plan view.

(Manufacture of Gallium Nitride Based Compound Semiconductor Light Emitting Device)

Gallium nitride based compound semiconductor layer was layered on a substrate 1 made of sapphire through a buffer layer 12 made of AlN. This gallium nitride based compound semiconductor layer comprises an n-type semiconductor layer where in an under layer made of undoped GaN of thickness 8 μm, a Ge-doped n-type GaN contact layer of thickness 2 μm, and an n-type $In_{0.1}Ga_{0.9}N$ cladding layer of thickness 0.02 μm are stacked sequentially, an Si-doped GaN barrier layer of thickness 16 nm and an $In_{0.06}Ga_{0.94}N$ well layer of thickness 2.5 nm stacked five times, and finally, a light emitting layer 14 with multiple quantum well structure provided with a barrier layer, and a p-type semiconductor layer 15 formed by stacking sequentially an Mg-doped p-type $Al_{0.07}Ga_{0.93}N$ cladding layer of thickness 0.01 μm and an Mg-doped p-type $Al_{0.02}Ga_{0.98}N$ contact layer of thickness 0.18 μm, with each layer being stacked in the above-mentioned sequence. The light extracting surface was taken on the side of the semiconductor.

In this construction, the carrier concentration of the n-type GaN contact layer was $1\times10^{19}$ $cm^{-3}$, the Si dopant quantity of the GaN barrier layer was $1\times10^{17}$ $cm^{-3}$, the carrier concentration of the p-type AlGaN contact layer was $5\times10^{18}$ $cm^{-3}$, and the Mg dopant quantity of p-type AlGaN cladding layer was $5\times10^{19}$ $cm^{-3}$.

Moreover, the gallium nitride based compound semiconductor layer was stacked (reference numerals 12, 13, 14, 15 of FIG. 1) under normal well-known conditions in the relevant technical field by the MOCVD method.

The n-type GaN contact layer of the area where negative electrode is formed in this gallium nitride based compound semiconductor layer was exposed by the reactive ion etching method. At this stage, first, the resist was uniformly applied all over the area of the p-type semiconductor layer, and subsequently, the resist was removed from the negative electrode formation area by using the publicly known lithographic technology. It was then set in the vacuum evaporator and stacked to increase the film thickness of Ni and Ti to approximately 50 nm and 300 nm respectively by the electron beam method under a pressure of $4\times10^{-4}$ Pa. Subsequently, the metallic film other than the negative electrode formation area was removed together with the resist by lift-off technology.

Next, the semiconductor stacked substrate was placed on the electrode in the etching chamber of the reactive ion etching device, the etching chamber pressure reduced to $10^{-4}$ Pa, $Cl_2$ supplied as the etching gas and the substrate was etched until the exposure of the n-type GaN contact layer. After etching, the substrate was removed from the reactive ion etching device, and the above-mentioned etching mask removed by nitric acid and fluoric acid.

(Formation of Uneven Pattern)

Next, using the publicly known photolithographic technology, resist film was formed on parts other than the surface of the p-type semiconductor layer, inserted in the evaporating device, and Au/Sn of thickness 15 nm was stacked.

Subsequently, it was subjected to heat treatment at 250° C. in a nitrogen environment, the Au/Sn thin film mentioned above was condensed to particle form, and a mask was formed from metallic fine particles. The diameter of metallic fine particles was in the range of 0.2 to 1.5 μm, and a metallic fine particle layer (mask) with a high-density of $2\times10^6$ particles/$mm^2$ was formed Next, to expose the surface of the p-type semiconductor layer, patterning was performed using the resist film, and the general-purpose dry etching was carried out.

In the area in which uneven pattern was to be processed, the metallic fine particle mask mentioned above was formed. Thus, etching was selectively performed in a shape matching the shape of the metallic fine particles by dry etching and the surface of the p-type semiconductor layer was processed in an uneven pattern shape with curved surface. This convex part had a gate-like shape in plan view with the average value of the lower end width being 0.7 μm (diameter) approximately, and the average value of the height T being 1.0 μm approximately. Moreover, the average value of the distance between the convex parts was 0.8 μm, and the standard deviation for this value was 50%.

(Formation of Light-Permeable Positive Electrode)

Next, using the publicly-known photolithographic technology and lift-off technology, a Ni-contact metal layer of thickness 1 nm and an electric current diffusion layer (light-permeable positive electrode) made of ITO were formed only in the area for forming positive electrode on the surface of the p-type AlGaN contact layer. During the formation of the electric current diffusion layer, first the substrate stacked with gallium nitride based compound semiconductor layer was placed in the vacuum sputtering device, and ITO was stacked up to 1 μm thickness on the p-type AlGaN contact layer. Subsequently, after removing it from the vacuum chamber, it was heat treated for making it transparent.

(Formation of Bonding Pad)

Next, the positive electrode bonding pad 17 and the negative electrode bonding pad 18 were formed by the procedure described below.

First, processing was carried out according to the publicly-known procedure called lift-off, and by the same stacking method, the first layer of Au, the second layer of Ti, the third layer of Al, the fourth layer of Ti, and the fifth layer of Au were sequentially stacked on a part of the ITO film, and the five-layered positive electrode bonding pad 17 was formed. Here, the thickness of each layer of Au/Ti/Al Ti/Au was 50/20/10/100/200 nm respectively.

Next, the negative bonding pad 18 was formed on the exposed n-type GaN contact layer by the procedure described below using the reactive ion etching method mentioned above.

First, the resist was uniformly applied all over the surface of the exposed area of the n-type GaN contact layer. Next, using the publicly known lithographic technology, the resist was removed from negative electrode formation part on the exposed n-type GaN contact layer. Subsequently, the negative electrode bonding pad 18 with Ti of 100 nm thickness and Au of 200 nm thickness, was formed sequentially from the semiconductor side by the commonly-used vacuum evaporation method. Then, the resist was removed by a publicly known method.

In this way, by grinding and polishing the rear surface of substrate 11, the board thickness of substrate was reduced to 80 μm. After scribing lines from the semiconductor-stacked side using a laser scriber, the wafer on which the positive and negative electrodes were formed was pressed and cut into 350-μm square chips.

(Measurement of Driving Voltage (Vf) and Output Power (Po))

The forward voltage (driving voltage: Vf) of these chips was measured by impressing a current of 20 mA using a probe needle, and it was found to be 3.3 V. Also, the chip was mounted in a TO-18 package, and the output power was measured using a tester. The output power was found to be 12 mW for an impressed current of 20 mA. The emitted light distribution on the light-emitting surface was confirmed to emit light over the entire surface of the light-permeable positive electrode.

(Measurement of Flux Distribution)

The flux distribution of the chip mentioned above was measured with the chip mounted in the TO-18 package. LED-1100 produced by Opto Science Ltd. was used for measuring the flux distribution.

First, the detector installed at the upper part of the chip was moved along a trajectory parallel to one of the sides of the chip while maintaining the same distance from the chip and the emission intensity was measured. Next, the detector was moved along the trajectory parallel to the side perpendicular to the first side while maintaining the same distance from the chip and the emission intensity was measured. The distribution of emission intensity corresponding to the angle made by the line joining the detector and the chip centerline with the substrate surface remained constant irrespective of the side along which the measurement was made.

Examples 2 to 10

Materials for the metallic fine particles were taken as shown in Table 1. The points at which heat treatment was carried out at the heating temperature shown in Table 1 were excluded and gallium nitride based compound semiconductor light emitting device was produced similar to Example 1.

Example 11

Points at which uneven pattern made of convex parts was not formed on the surface of the p-type semiconductor layer were excluded, and gallium nitride based compound semiconductor light emitting device was produced similar to Example 1.

Examples 12 to 13

Points at which the average value and the standard deviation of convex parts on the surface of the p-type semiconductor layer became the same as the values indicated in Table 1 were excluded, and gallium nitride based compound semiconductor light emitting device was produced similar to Example 1.

Table 1 shows a list of conditions for uneven shapes, convex part distances and device characteristics of Examples 1 to 13 mentioned above.

TABLE 1

| | Materials of metallic fine particle mask (composition) | Melting point of metallic fine particle mask (° C.) | Heat treatment temperature (° C.) | Average distance of convex parts (μm) | Standard deviation of average distances of convex parts (%) | Average lower end width of convex part (μm) | Driving voltage (Vf) (V) | Output power (Po) (mW) |
|---|---|---|---|---|---|---|---|---|
| Example 1 | Au/Sn | 278 | 250 | 0.8 | 50 | 0.5 | 3.3 | 12 |
| Example 2 | Ni | 1455 | 600 | 0.5 | 55 | 0.2 | 3.3 | 11 |
| Example 3 | Au/Ge (Ge 14%) | 361 | 450 | 0.5 | 40 | 0.3 | 3.3 | 11 |
| Example 4 | Au/Pb (Pb 84%) | 213 | 220 | 0.9 | 30 | 0.6 | 3.3 | 12 |
| Example 5 | Au/In (In 28%) | 224 | 230 | 0.8 | 30 | 0.6 | 3.3 | 11 |
| Example 6 | Au/Bi (Bi 87%) | 241 | 250 | 0.9 | 20 | 0.5 | 3.3 | 12 |
| Example 7 | Au/Cd (Cd 48%) | 309 | 320 | 0.5 | 15 | 0.3 | 3.3 | 11 |
| Example 8 | Au/Sb (Sb 25%) | 380 | 400 | 0.6 | 30 | 0.4 | 3.3 | 11 |
| Example 9 | Au/Bi (Bi 55%) | 126 | 150 | 1.1 | 35 | 0.8 | 3.3 | 11 |
| Example 10 | Au/Sb (Sb 12%) | 252 | 260 | 0.7 | 45 | 0.5 | 3.3 | 11 |
| Example 11 | None uneven pattern | | | | | | 3.3 | 9 |
| Example 12 | Au/Sn | 278 | 250 | 1.8 | 50 | 0.5 | 3.3 | 9 |
| Example 13 | Au/Sn | 278 | 250 | 0.8 | 85 | 0.5 | 3.3 | 9 |

From the results of evaluation of device characteristics shown in Table 1, the average distance of convex parts of the gallium nitride based compound semiconductor light emitting device of Examples 1 to 10 wherein disordered uneven surface was formed on the surface of the p-type semiconductor layer, was in the range of 0.05 to 1.5 μm, and the standard deviation corresponding to the average distance of the convex parts was in the range of 10 to 80%.

The output power of the gallium nitride based compound semiconductor light emitting device of the present invention shown in each of the Examples 1 to 10 was greater than 11 mW.

In the gallium nitride based compound semiconductor light emitting device of Example 2, Ni was used as the material of the metallic fine particle mask. The melting point of the metallic fine particle mask was extremely high at 1455° C., and the heat treatment temperature when forming the mask was also 600° C., but the standard deviation corresponding to the average distance of the convex parts was 55%.

The gallium nitride based compound semiconductor light emitting device of Example 11 wherein uneven pattern was not formed on the surface of the p-type semiconductor layer had an output power of 9 mW.

The average distance between the convex parts in the gallium nitride based compound semiconductor light emitting device shown in Example 12 was 1.8 μm. The standard deviation corresponding to this average distance was 50%. The light emitting device of Example 12 had an output power of 9 mW.

The average distance between the convex parts in the gallium nitride based compound semiconductor light emitting device shown in Example 13 was 0.8 μm. The standard deviation corresponding to this average distance was 85%. The light emitting device of Example 13 had an output power of 9 mW.

From the results above, it is clear that the gallium nitride based compound semiconductor light emitting device of the present invention has excellent light extracting efficiency and high device characteristics.

INDUSTRIAL APPLICABILITY

The gallium nitride based compound semiconductor light emitting device offered by the present invention, although small, gives high-emitted output power by emitting light from an area that conventionally did not emit light. Effects of improved productivity are also anticipated. If a lamp comprising gallium nitride based compound semiconductor light emitting device is used, an LED lamp with higher output power can be produced than a conventional one by improving the physical contact characteristics with resin material. Accordingly, the invention is very useful considering industrial applicability.

The invention claimed is:

1. A gallium nitride based compound semiconductor light emitting device production method, for forming an uneven surface at least on a part of the p-type semiconductor layer of the gallium nitride based compound semiconductor device, comprising:
    process 1, stacking an n-type semiconductor layer, a light emitting layer, and a p-type semiconductor layer sequentially to form gallium nitride based compound semiconductor on a substrate;
    process 2, forming a mask made of metallic particles on the p-type semiconductor layer; and
    process 3, dry-etching p-type semiconductor layer using the mask made of metallic particles as an etching mask to form the uneven surface.

2. A production method of gallium nitride based compound semiconductor light emitting device according to claim 1, wherein the process 2 comprises a process forming a metallic film on the p-type semiconductor layer and a heat treatment process after the formation of the metallic film.

3. A production method of gallium nitride based compound semiconductor light emitting device according to claim 1, wherein the metallic particles that form the mask are obtained from Ni or Ni alloy.

4. A production method of gallium nitride based compound semiconductor light emitting device according to claim 1, wherein the metallic particles that form the mask are obtained from a low melting point metal or a low melting point alloy with a melting point in a range of 100° C. to 450° C.

5. A production method of gallium nitride based compound semiconductor light emitting device according to claim 1, wherein the metallic particles that form the mask are obtained from a low melting point metal selected from a group consisting of Ni, Au, Sn, Ge, Pb, Sb, Bi, Cd, and In, or obtained from a low melting point alloy comprising at least one of the low melting point metal selected from the same group.

* * * * *